United States Patent
Hartsough et al.

[11] Patent Number: 5,985,115
[45] Date of Patent: Nov. 16, 1999

[54] INTERNALLY COOLED TARGET ASSEMBLY FOR MAGNETRON SPUTTERING

[75] Inventors: Larry D. Hartsough, Berkeley; David J. Harra, Aptos, both of Calif.; Ronald R. Cochran, Medford, Oreg.; Mingwei Jiang, Sunnyvale, Calif.

[73] Assignee: Novellus Systems, Inc., San Jose, Calif.

[21] Appl. No.: 08/832,718

[22] Filed: Apr. 11, 1997

[51] Int. Cl.⁶ .................................................. C23C 14/34
[52] U.S. Cl. ............................... 204/298.09; 204/298.12; 204/298.2; 204/298.22
[58] Field of Search .................. 204/298.02, 298.09, 204/298.12, 298.2, 298.22

[56] References Cited

U.S. PATENT DOCUMENTS

| | | | |
|---|---|---|---|
| 3,369,991 | 2/1968 | Davidse et al. | 204/298 |
| 3,630,881 | 12/1971 | Lester et al. | 204/298 |

(List continued on next page.)

FOREIGN PATENT DOCUMENTS

| | | | |
|---|---|---|---|
| 0 070 574 | 1/1983 | European Pat. Off. | C23C 15/00 |
| 0 163 445 | 12/1985 | European Pat. Off. | H01L 21/203 |
| 0 163 446 | 12/1985 | European Pat. Off. | H01L 21/203 |
| 0 337 012 | 10/1989 | European Pat. Off. | H01J 37/34 |
| 0 439 360 | 7/1991 | European Pat. Off. | H01J 37/34 |
| 0 440 377 | 8/1991 | European Pat. Off. | H01J 37/34 |
| 0 482 541 | 4/1992 | European Pat. Off. | H01J 37/32 |
| 0 590 904 | 4/1994 | European Pat. Off. | C23C 14/34 |
| 0 654 543 | 5/1995 | European Pat. Off. | C23C 14/34 |
| 2 232 832 | 2/1975 | France | H01J 7/20 |
| 23 50 322 | 4/1975 | Germany | C23C 15/00 |
| 57-126969 | 8/1982 | Japan | C23C 15/00 |
| 58-016068 | 1/1983 | Japan | C23C 15/00 |
| 58-087270 | 5/1983 | Japan | C23C 15/00 |
| 59-215485 | 12/1984 | Japan | C23C 15/00 |
| 60-262968 | 12/1985 | Japan | C23C 14/34 |
| 63-035770 | 2/1988 | Japan | C23C 14/34 |
| 63-270459 | 11/1988 | Japan | C23C 14/34 |
| 63-290269 | 11/1988 | Japan | C23C 14/34 |
| 1-147061 | 6/1989 | Japan | C23C 14/34 |
| 2-298263 | 12/1990 | Japan | C23C 14/34 |
| 60-255974 | 3/1991 | Japan | C23C 14/35 |
| 3-140464 | 6/1991 | Japan | C23C 14/34 |
| 1 453 377 | 10/1976 | United Kingdom | C23C 15/00 |
| 1476079 | 6/1977 | United Kingdom | C23C 15/00 |
| 2 129 021 | 5/1984 | United Kingdom | C23C 15/00 |
| 2173217 | 10/1986 | United Kingdom | C23C 14/34 |
| 81/03345 | 11/1981 | WIPO | C23C 15/00 |
| 90/13137 | 11/1990 | WIPO | H01J 37/34 |
| 93/04211 | 3/1993 | WIPO | C23C 14/34 |
| 93/12264 | 6/1993 | WIPO | C23C 14/34 |

OTHER PUBLICATIONS

Calvo et al., "Diffusion Bonding of Ti–6A1–4V Alloy: Metallurgical Aspects and Mechanical Properties", 1991, Elsevier Science Publishing Co., Inc., pp. 144–157.

Korman et al., "Research Study of Diffusion Bonding of Refractory Materials, Columbium and Tantalum", Nov. 10, 1967, AAMRC Final Report Research Study CR 67–15(F), pp. 1–27.

Pineau et al., "The Investigation and Production of Titanium–Tantalum Junctions Diffusion Bonded at High Temperature (855 to 920° C.): The Influence of Temperature, Time, Pressure and Roughness on the Mechanical Properties, and the Optimisation of the Bonded Conditions:", Jan. 1990, Royal Aerospace Establishment, Library Translation 2180, pp. 1–35.

Tensi et al., "Influence of Surface Preparation on the Diffusion Welding of High Strength Aluminum Alloys", 1991, Elsevier Applied Science, Diffusion Bonding 2, pp. 101–110.

*Primary Examiner*—Nam Nguyen
*Assistant Examiner*—Steven H. Ver Steeg
*Attorney, Agent, or Firm*—Roland Tso

[57] ABSTRACT

An internally cooled target assembly for use in a magnetron sputtering apparatus is provided. The internally cooled target assembly includes a cooling plate that is configured to promote highly turbulent coolant flow through the target assembly to achieve efficient and uniform target cooling. The volume of coolant required to cool the target assembly is minimized.

8 Claims, 5 Drawing Sheets

U.S. PATENT DOCUMENTS

| | | | |
|---|---|---|---|
| 3,669,871 | 6/1972 | Elmgren et al. | 204/298 |
| 3,726,776 | 4/1973 | Cuomo et al. | 204/192 |
| 3,838,028 | 9/1974 | Needham et al. | 204/298 |
| 3,878,085 | 4/1975 | Corbani | 204/298 |
| 3,887,451 | 6/1975 | Cuomo et al. | 204/192 |
| 3,892,650 | 7/1975 | Cuomo et al. | 204/192 |
| 3,933,644 | 1/1976 | Skinner et al. | 204/298 |
| 3,956,093 | 5/1976 | McLeod | 204/192 |
| 4,043,889 | 8/1977 | Kochel | 204/192 |
| 4,060,470 | 11/1977 | Clarke | 204/192 |
| 4,100,055 | 7/1978 | Rainey | 204/298 |
| 4,116,806 | 9/1978 | Love et al. | 204/298 |
| 4,166,018 | 8/1979 | Chapin | 204/192 |
| 4,169,031 | 9/1979 | Brors | 204/192 |
| 4,175,030 | 11/1979 | Love et al. | 204/298 |
| 4,183,797 | 1/1980 | Kennedy et al. | 204/192 |
| 4,198,283 | 4/1980 | Class et al. | 204/298 |
| 4,219,397 | 8/1980 | Clarke | 204/192 |
| 4,275,126 | 6/1981 | Bergmann et al. | 429/30 |
| 4,282,083 | 8/1981 | Kertesz et al. | 204/298 |
| 4,299,678 | 11/1981 | Meckel | 204/192 |
| 4,309,266 | 1/1982 | Nakamura et al. | 204/298 |
| 4,318,796 | 3/1982 | Nishiyama et al. | 204/298 |
| 4,356,073 | 10/1982 | McKelvey | 204/192 |
| 4,384,933 | 5/1983 | Takasaki | 204/192 |
| 4,385,979 | 5/1983 | Pierce et al. | 204/298 |
| 4,401,539 | 8/1983 | Abe et al. | 204/192 |
| 4,405,436 | 9/1983 | Kobayashi et al. | 204/298 |
| 4,415,427 | 11/1983 | Hidler et al. | 204/298 |
| 4,416,759 | 11/1983 | Harra et al. | 204/298 |
| 4,422,916 | 12/1983 | McKelvey | 204/192 |
| 4,426,264 | 1/1984 | Münz et al. | 204/192 |
| 4,430,190 | 2/1984 | Eilers et al. | 204/298 |
| 4,431,505 | 2/1984 | Morrison, Jr. | 204/298 |
| 4,434,037 | 2/1984 | Crank | 204/192 |
| 4,444,635 | 4/1984 | Kobayashi et al. | 204/192 |
| 4,444,643 | 4/1984 | Garrett | 204/298 |
| 4,457,825 | 7/1984 | Lamont, Jr. | 204/298 |
| 4,491,509 | 1/1985 | Krause | 204/192 |
| 4,498,969 | 2/1985 | Ramachandran | 204/298 |
| 4,500,409 | 2/1985 | Boys et al. | 204/298 |
| 4,508,612 | 4/1985 | Blackwell et al. | 204/298 |
| 4,517,070 | 5/1985 | Kisner | 204/298 |
| 4,564,435 | 1/1986 | Wickersham | 204/298 |
| 4,569,745 | 2/1986 | Nagashima | 204/298 |
| 4,569,746 | 2/1986 | Hutchinson | 204/298 |
| 4,595,482 | 6/1986 | Mintz | 204/298 |
| 4,606,806 | 8/1986 | Helmer | 204/298 |
| 4,622,121 | 11/1986 | Wegmann et al. | 204/298 |
| 4,622,122 | 11/1986 | Landau | 204/298 |
| 4,627,904 | 12/1986 | Mintz | 204/298 |
| 4,631,106 | 12/1986 | Nakazato et al. | 156/345 |
| 4,657,654 | 4/1987 | Mintz | 204/298 |
| 4,661,228 | 4/1987 | Mintz | 204/192.25 |
| 4,673,480 | 6/1987 | Lamont, Jr. | 204/298 |
| 4,680,061 | 7/1987 | Lamont, Jr. | 148/1.5 |
| 4,714,536 | 12/1987 | Freeman et al. | 204/298 |
| 4,734,183 | 3/1988 | Wirz et al. | 204/298 |
| 4,746,417 | 5/1988 | Ferenbach et al. | 204/298 |
| 4,747,926 | 5/1988 | Shimizu et al. | 204/298 |
| 4,761,218 | 8/1988 | Boys | 204/298 |
| 4,826,584 | 5/1989 | des Santos Pereiro Ribeiro | 204/298 |
| 4,839,011 | 6/1989 | Ramalingam et al. | 204/192.38 |
| 4,865,712 | 9/1989 | Mintz | 204/298 |
| 4,904,362 | 2/1990 | Gaertner et al. | 204/192.12 |
| 4,909,315 | 3/1990 | Nelson et al. | 165/80.3 |
| 4,915,805 | 4/1990 | Rust | 204/192.12 |
| 4,931,158 | 6/1990 | Bunshah et al. | 204/192.29 |
| 4,937,205 | 6/1990 | Nakayama et al. | 437/165 |
| 4,957,605 | 9/1990 | Hurwitt et al. | 204/192.12 |
| 4,978,437 | 12/1990 | Wirz | 204/192.23 |
| 4,995,958 | 2/1991 | Anderson et al. | 204/298.2 |
| 5,033,538 | 7/1991 | Wagner et al. | 165/80.1 |
| 5,047,130 | 9/1991 | Akao et al. | 204/192.12 |
| 5,096,562 | 3/1992 | Boozenny et al. | 204/298 |
| 5,126,028 | 6/1992 | Hurwitt et al. | 204/192.13 |
| 5,130,005 | 7/1992 | Hurwitt et al. | 204/192.12 |
| 5,171,415 | 12/1992 | Miller et al. | 204/298.09 |
| 5,174,875 | 12/1992 | Hurwitt et al. | 204/192.12 |
| 5,177,878 | 1/1993 | Visser | 34/92 |
| 5,180,478 | 1/1993 | Hughes | 204/298.09 |
| 5,188,717 | 2/1993 | Broadbent et al. | 204/192.12 |
| 5,203,980 | 4/1993 | Cremer et al. | 204/298.08 |
| 5,244,556 | 9/1993 | Inoue | 204/192.12 |
| 5,252,194 | 10/1993 | Demaray et al. | 204/298.2 |
| 5,259,941 | 11/1993 | Münz | 204/298.09 |
| 5,262,030 | 11/1993 | Potter | 204/298.2 |
| 5,281,320 | 1/1994 | Turner et al. | 204/298.15 |
| 5,328,582 | 7/1994 | Cole | 204/192.12 |
| 5,328,585 | 7/1994 | Stevenson et al. | 204/298.2 |
| 5,330,628 | 7/1994 | Demaray et al. | 204/192.12 |
| 5,333,726 | 8/1994 | Makowiecki et al. | 204/298.09 |
| 5,382,344 | 1/1995 | Hosokawa et al. | 204/298.2 |
| 5,433,835 | 7/1995 | Demaray et al. | 204/298.09 |
| 5,441,614 | 8/1995 | Krause et al. | 204/192.12 |
| 5,458,759 | 10/1995 | Hosokawa et al. | 204/298.2 |
| 5,487,822 | 1/1996 | Demaray et al. | 204/298.09 |
| 5,628,889 | 5/1997 | Gardell et al. | 204/298.09 |
| 5,635,036 | 6/1997 | Demaray et al. | 204/192.12 |
| 5,676,803 | 10/1997 | Demaray et al. | 204/192.12 |

INTERNALLY COOLED TARGET ASSEMBLY FOR MAGNETRON SPUTTERING

BACKGROUND OF THE INVENTION

The present invention relates generally to magnetron sputtering devices, and particularly to an internally cooled target assembly for use in a magnetron sputtering device. More particularly, the present invention relates to an improved internally cooled target assembly configured to promote highly turbulent coolant flow through the target assembly to achieve efficient and uniform target cooling while minimizing the volume of coolant needed to cool the target assembly.

Magnetron sputtering devices have long been used by the semiconductor processing industry to coat substrates (e.g., silicon wafers) with various materials (e.g., aluminum, titanium, gold, etc.) during the manufacture of integrated circuits. Generally, in a sputtering device, the material to be deposited or sputtered on the substrate is contained in a target. The substrate is placed on a substrate support table in a sputtering chamber. Air in the sputtering chamber is evacuated and replaced with an inert gas such as argon, preferably at a low pressure. An electric field is established between an anode such as the walls that line the sputtering chamber and the target. The target acts as an electron source, or a cathode. Ions are formed when electrons collide with the inert gas. The ions are then drawn toward the target by the electric field. The ions impact the target with sufficient energy to dislodge, or sputter, atoms of target material into the sputtering chamber. The sputtered atoms travel from the target surface to the substrate, coating the substrate with a thin film of target material. The target erodes more quickly in regions where more ions impact the target. The cloud of free electrons, inert gas atoms, inert gas ions and sputtered atoms that exist near the target sputtering surface is termed a "plasma discharge."

The location of plasma discharge may be controlled by introducing a magnetic field adjacent to the sputtering surface of the target in the sputtering chamber. The magnetic field is generated by a rotating magnetic circuit located on the side of the target opposite the sputtering surface. The magnetic field acts to trap electrons in a desired region so that ionization is concentrated in that region. Creation of such a region adjacent to the target surface results in a corresponding region of plasma discharge and erosion in the target sputtering surface. The region of plasma discharge rotates with the magnetic circuit about an axis that is perpendicular to the target sputtering surface.

Uniformity of the thickness of the film of material deposited onto a substrate is an important parameter in magnetron sputtering. Film thickness uniformity has become increasingly important as the semiconductor processing industry reduces semiconductor device geometries to achieve greater device densities. At the same time that uniformity requirements have become more stringent, the use of larger, 200 mm semiconductor substrates has become increasingly common. The use of larger substrates makes it more difficult to meet tighter uniformity requirements.

Uniformity may be improved by increasing the diameter of the targets used in magnetron sputtering devices. Sputtering with a larger target provides a more even distribution of sputtered material in the vicinity of the substrate. It has been found that significant improvements in film thickness uniformity on 200 mm substrates may be achieved by using sputtering targets having diameters of about 350 mm or more. To achieve this benefit, the magnetron sputtering device must be configured to generate a plasma discharge at remote radii of the larger target to cause sputtering to occur at the remote radii.

Although the use of larger targets in magnetron sputtering devices may contribute to improved film thickness uniformity, there remain difficulties associated with the use of larger targets that have yet to be addressed. It is generally known that the sputtering process generates a substantial amount of energy in the form of heat in the sputtering target. The heat generated during sputtering needs to be dissipated; otherwise, the heat may damage the target and other components of the magnetron sputtering device.

In one previously known approach for cooling a sputtering target, a water-tight cooling chamber is formed on the side of the target opposite the target sputtering surface. The non-sputtering surface of the target forms one wall of the cooling chamber. The cooling chamber is filled with coolant (e.g., water), thus flooding the non-sputtering surface of the target with coolant. The coolant dissipates the heat generated in the target during sputtering. With this approach, the rotating magnet is immersed in the coolant.

Although a cooling chamber is effective for cooling smaller diameter targets, some difficulties arise when this approach is used for larger targets. For example, the target is subjected to a large pressure difference between the evacuated sputtering chamber on the sputtering surface side of the target and the coolant-filled cooling chamber on the non-sputtering surface side. This large pressure difference may cause the target to bow toward the substrate. A larger diameter target will bow more than a smaller diameter target, unless the larger diameter target is made thicker to withstand the greater pressure difference. However, increasing the thickness of the target increases the distance between the rotating magnet and the sputtering surface of the target, thereby undesirably reducing the intensity of the magnetic field at the sputtering surface.

Another approach to cooling a sputtering target includes forming internal cooling channels in a multi-layer target assembly as disclosed, for example, in U.S. patent application Ser. No. 08/684,440 of Anderson entitled SPUTTERING DEVICE AND LIQUID COOLED TARGET ASSEMBLY THEREFOR, assigned to Varian Associates Inc., which now abandoned is incorporated herein by reference. The cooling channels in the multi-layer target assembly may include a plurality of parallel cooling channels which connect a coolant input port to a coolant output port of the multi-layer target assembly. The parallel channels distribute coolant received through the input port throughout the target assembly to uniformly cool the target assembly. After flowing through the parallel passages, the coolant leaves the target assembly through the output port.

Highly turbulent coolant flow (e.g., Reynolds number greater than about 4000) through the cooling channels of an internally cooled target assembly is desirable to efficiently cool the target assembly. It is also desirable to keep the exit temperature of the coolant below about 60° C. for safety reasons. It has been difficult, however, to obtain highly turbulent coolant flow using low coolant volume while keeping the exit temperature of the coolant below about 60° C. It has also been difficult to achieve highly turbulent coolant flow in coolant channels remotely located from the coolant input port due to the pressure drop caused by coolant flowing into the coolant channels located near the coolant input port.

In the course of manufacturing a multi-layer target assembly, extreme heat and pressure may be used during the process of bonding the layers together. A difficulty that may be encountered when parallel cooling channels are used in an internally cooled target assembly is that the layer within which the grooves are formed may have a tendency to easily bend parallel to the cooling channels when extreme heat and pressure are applied. This may create defects in the bonds between the layers of the multi-layer target assembly. Use of a target assembly that incorporates such bonding defects can potentially lead to coolant leaks in the target assembly and loss of vacuum in the sputtering chamber.

In view of the foregoing, it would be desirable to provide an internally cooled target assembly for a magnetron sputtering device in which efficient target cooling is achieved through the use of highly turbulent coolant flow through cooling channels in the target assembly.

It would also be desirable to provide an internally cooled target assembly for a magnetron sputtering device in which efficient target cooling is achieved using highly turbulent coolant flow while minimizing the volume of coolant needed to cool the target.

It would further be desirable to provide an internally cooled target assembly for a magnetron sputtering device in which efficient target cooling is achieved using highly turbulent coolant flow while minimizing the volume of coolant needed to cool the target and keeping the exit temperature of the coolant below about 60° C.

It would still further be desirable to provide an internally cooled target assembly for a magnetron sputtering device in which uniform target cooling is achieved using highly turbulent coolant flow through each of a plurality of parallel cooling channels in the target assembly, including cooling channels remotely located from a coolant input port of the target assembly.

It would even further be desirable to provide an internally cooled target assembly for a magnetron sputtering device that is resistant to bonding defects which may be induced by the presence of cooling channels in the target assembly.

SUMMARY OF THE INVENTION

It is an object of the present invention to provide an internally cooled target assembly for a magnetron sputtering device in which efficient target cooling is achieved through the use of highly turbulent coolant flow through cooling channels in the target assembly.

It is another object of the present invention to provide an internally cooled target assembly for a magnetron sputtering device in which efficient target cooling is achieved using highly turbulent coolant flow while minimizing the volume of coolant needed to cool the target.

It is a further object of the present invention to provide an internally cooled target assembly for a magnetron sputtering device in which efficient target cooling is achieved using highly turbulent coolant flow while minimizing the volume of coolant needed to cool the target and keeping the exit temperature of the coolant below about 60° C.

It is a still further object of the present invention to provide an internally cooled target assembly for a magnetron sputtering device in which uniform target cooling is achieved using highly turbulent coolant flow through each of a plurality of parallel cooling channels in the target assembly, including cooling channels remotely located from a coolant input port of the target assembly.

It is an even further object of the present invention to provide an internally cooled target assembly for a magnetron sputtering device that is resistant to bonding defects which may be induced by the presence of cooling channels in the target assembly.

In accordance with the present invention, an improved internally cooled target assembly for a magnetron sputtering device is provided. The internally cooled target assembly is configured to promote highly turbulent coolant flow through the target assembly to achieve efficient and uniform target cooling while minimizing the volume of coolant needed to cool the target assembly.

The improved internally cooled target assembly of the present invention includes an input port through which coolant is received into the target assembly, and an output port through which coolant is expelled from the target assembly. The target assembly also includes a plurality of cooling channels for distributing the coolant through the target assembly. The cooling channels have first ends which receive coolant provided through the input port and second ends coupled to the output port. The target assembly further includes an input manifold which couples the input port to the first ends of the cooling channels. The input manifold has a hydrodynamic impedance per distance that increases in a direction away from the input port. The increasing hydrodynamic impedance per distance of the input manifold induces substantially uniform coolant flow through the plurality of cooling channels.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION OF THE PREFERRED EMBODIMENTS

Figure 1:
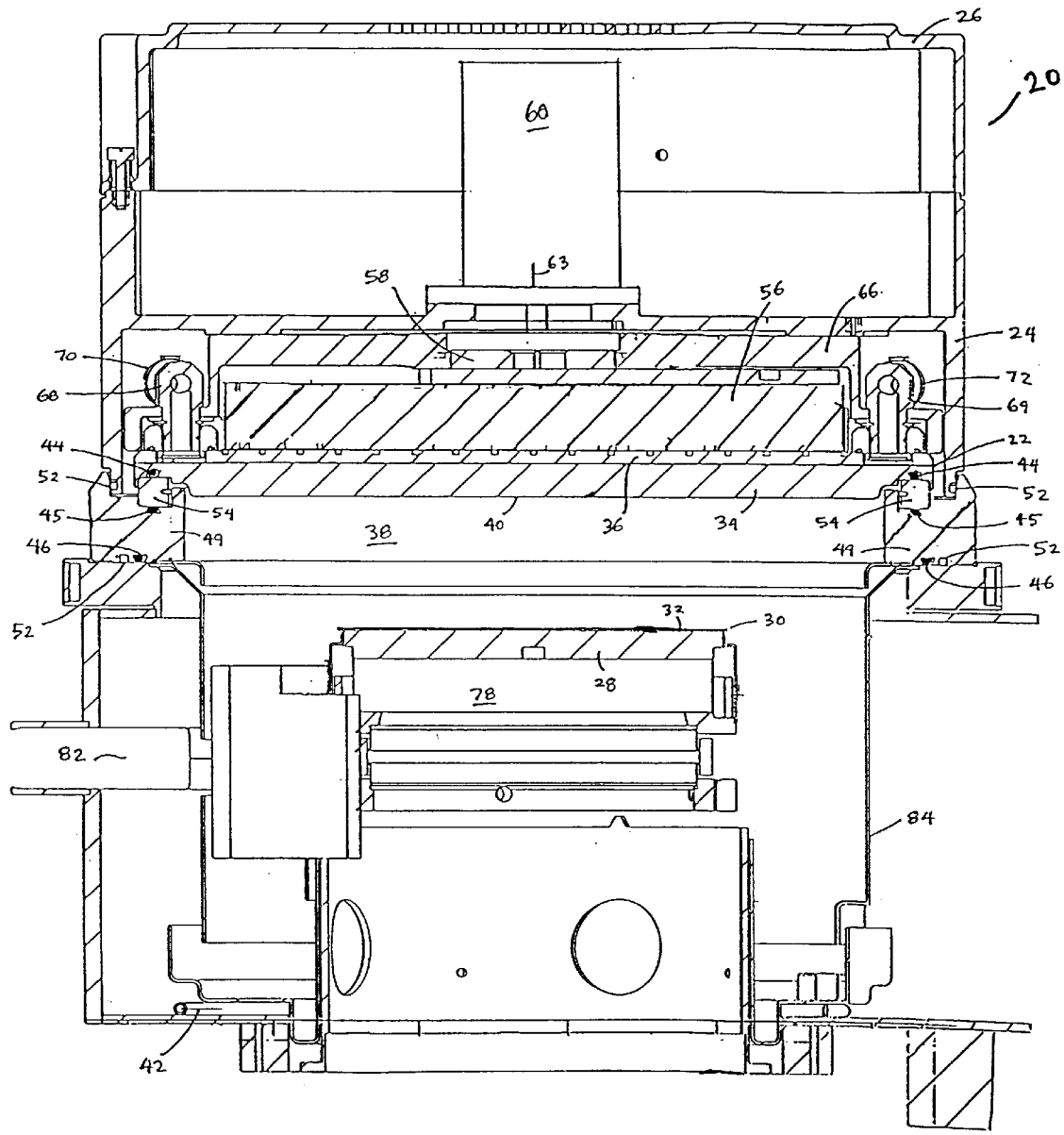
FIG. 1 is a cross-sectional view of a magnetron sputtering apparatus that includes an internally cooled target assembly in accordance with the principles of the present invention.

Referring first to FIG. 1, a cross-sectional view of a magnetron sputtering apparatus 20 having an internally cooled target assembly 22 in accordance with the principles of the present invention is described. sputtering apparatus 20 includes metal housing 24, housing cover 26, and substrate support table 28 for supporting substrate 30. Substrate 30 has an upper surface 32 that is intended to be sputter coated with a thin film of material by sputtering apparatus 20. Substrate 30 may be, for example, a semiconductor wafer.

Target assembly 22 may be a large diameter target assembly (e.g., about 350 mm or more) which facilitates sputtering a film of material having a highly uniform thickness on upper surface 32 of substrate 30. Target assembly 22 includes target 34, which may be a monolithic target as described below in connection with FIG. 6 or a composite target as described below in connection with FIG. 7. Target assembly 22 also includes a cooling plate 36 bonded to target 34. As described below, cooling plate 36 is configured to establish highly turbulent coolant flow through target assembly 22 in order to efficiently and uniformly cool target assembly 22 while minimizing the volume of coolant needed to cool target assembly 22.

Sputtering takes place in sputtering chamber 38. Lower surface 40 of target 34 from which material is sputtered is inside sputtering chamber 38. Substrate 30 is also within sputtering chamber 38. A vacuum system (not shown) is connected to sputtering chamber 38. The vacuum system acts to remove air from sputtering chamber 38 so that air may be replaced with an inert gas such as argon at low pressure. The inert gas provides the medium for ionization. Sputtering apparatus 20 generates electric fields, using a power supply and electrical connections (not shown), to create regions of high electron density between target 34 and substrate 30 which facilitate ionization of the inert gas. Inert gas pressures ranging from 0.1 millitorr to 5 millitorr are typical. The gas is introduced into sputtering chamber 38 via inlet tube 42. O-rings 44, 45 and 46 serve to maintain the pressure differential between sputtering chamber 38 and the atmosphere.

As mentioned above, sputtering apparatus 20 establishes an electric field in sputtering chamber 38 that is required to sputter target 34. Target 34 is placed at a negative potential through a connection to a power supply (now shown). Target 34 thus acts as a cathode. The magnitude of the negative potential can be adjusted within the range from about 0 Volts to about 1500 Volts. Sputtering typically takes place in the range from about 250 Volts to about 800 Volts.

Dark space ring 49 surrounding sputtering chamber 38 is placed at ground potential, acting as an anode. Dark space ring 49 is grounded through an electrical contact with housing 24. Dark space ring 49 is maintained at ground potential so that an electric field is established between dark space ring 49 and target 34. Dark space ring 49, which is preferably made of stainless steel to withstand cleaning, is electrically connected to housing 24 via conductive springs 52.

Ceramic insulator 54 is secured between target 34 and dark space ring 49 to provide electrical insulation therebetween. Substrate support table 28 also contributes to the electric field, but because substrate support table 28 is not grounded and is electrically isolated from housing 24 and target 34, its contribution to the electric field is not as great as that of dark space ring 49. The electric field intersects target 34 at an angle that is substantially normal to lower surface 40 of target 34 to create a plasma discharge in which ionized gas atoms are forced into lower surface 40 of target 34 with sufficient energy to sputter the target atoms. Some of the sputtered target atoms land on substrate 30 and form a thin film of target material on upper surface 32 of substrate 30.

Sputtering apparatus 20 also includes magnet assembly 56. Magnet assembly 56 is used to control the location of plasma discharge at lower surface 40 of target 34. Magnet assembly 56 is secured for rotation on magnet assembly mounting plate 58. Motor 60 rotates magnet assembly 56 through magnet assembly mounting plate 58. Magnet assembly mounting plate 58 is supported for rotation about axis 63. Plastic insulating wall 66 surrounds magnet assembly 56, electrically isolating magnet assembly 56 from housing 24, which is at ground potential. Magnet assembly 56 preferably includes a magnetic circuit (not shown) that maximizes target material utilization while promoting uniformity of the thickness of the thin film of material deposited on substrate 30. A magnetic circuit that is suitable for use with larger diameter targets is disclosed in concurrently filed U.S. patent application Ser. No. 08/840,091 pending of Nordquist entitled MAGNETIC CIRCUIT FOR MAGNETRON SPUTTERING, assigned to Varian Associates Inc., which is incorporated herein by reference.

Coolant for target assembly 22 is provided through coolant connectors 68 and 69 and coolant hoses 70 and 72. Coolant hoses 70 and 72 are connected to external hoses (not shown) which supply coolant to sputtering apparatus 20. From their connections to the external coolant hoses (not shown), coolant hoses 70 and 72 extend around the perimeter of sputtering apparatus 20 and terminate at coolant connectors 68 and 69, respectively. Dark space ring 49 may also be cooled by coolant flowing through a cooling channel (not shown) in dark space ring 49. A typical coolant is water.

Substrate support table 28 contains a heat transfer apparatus 78 for controlling the temperature of substrate 30 which is clamped to the substrate support table 28 by a clamp (not shown). For some sputtering processes, gas may be introduced between substrate 30 and substrate support table 28 to aid in heat transfer. It is also known to use electrostatic clamping as an alternative to mechanical clamping. The top surface of substrate support table 28 is positionable from about 1 inch to about 4 inches below lower surface 40 of target 34. The distance between the top surface of substrate support table 28 and target 34 may be set by adjusting the size of dark space ring 49, and by raising or lowering substrate support table 28.

Sputtering apparatus 20 also includes port 82 which serves as an inlet/outlet for transferring substrates into and out of sputtering chamber 38 in a conventional manner. Port 82 is sealable by a conventional gate valve (not shown). In addition, sputtering apparatus 20 contains a barrel shaped deposition shield 84 which is maintained at ground potential and serves to accumulate sputtered atoms which do not land on substrate 30. Deposition shield 84 is easily cleaned.

Figure 2:
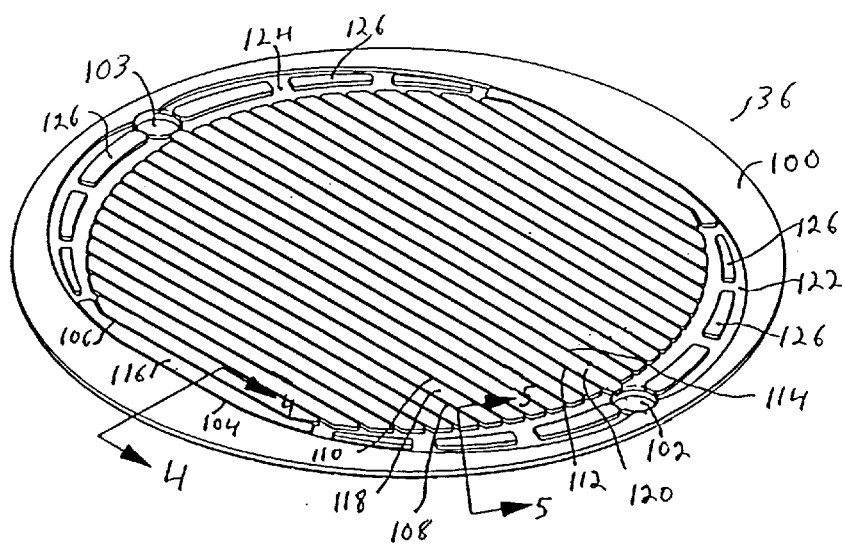
FIG. 2 is a perspective view of the cooling plate shown in FIG. 1, depicting a surface of the cooling plate having cooling channels in accordance with the principles of the present invention.

Referring now to FIG. 2, a perspective view of cooling plate 36 is described. Cooling plate 36, which is preferably made from aluminum or stainless steel, is configured to uniformly and efficiently cool target assembly 22 by inducing highly turbulent coolant flow through target assembly 22.

A lower surface 100 of cooling plate 36 is shown in FIG. 2. Lower surface 100 of cooling plate 36 is the surface that is bonded to target 34 (FIG. 1). Cooling plate 36 has an input port 102 for receiving coolant supplied through coolant connector 68 (FIG. 1) and hose 70 (FIG. 1). Cooling plate 36 also has an output port 103 through which coolant is expelled. The expelled coolant is removed through coolant connector 69 (FIG. 1) and hose 72 (FIG. 1), and ultimately exits sputtering apparatus 20 (FIG. 1) through an external hose (not shown) connected to hose 72.

A plurality of narrow, parallel cooling channels is formed in lower surface 100 of cooling plate 36, including cooling channels 104, 106, 108, 110, 112 and 114. The cooling channels are separated by a plurality of partitioning walls. For example, cooling channels 104 and 106 are separated by partitioning wall 116; cooling channels 108 and 110 are separated by partitioning wall 118; and cooling channels 112 and 114 are separated by partitioning wall 120.

Lower surface 100 of cooling plate 36 further includes input manifold 122 and output manifold 124. Input manifold 122 provides a fluid connection between one end of each cooling channel (e.g., cooling channels 104, 106, 108, 110, 112 and 114) and input port 102. Output manifold 124 provides a fluid connection between the opposite end of each cooling channel and output port 103. Input port 102 and output port 103 are preferably centrally located within input manifold 122 and output manifold 124, respectfully. This results in an equal number of cooling channels on both sides of input port 102 and output port 103.

Input manifold 122 and output manifold 124 each include a plurality of islands 126. Islands 126 facilitate bonding of cooling plate 36 to target 34 (FIG. 1) by providing additional regions for contacting target 34 (FIG. 1).

When cooling plate 36 is bonded to target 34 (FIG. 1) an enclosed cooling network is formed by the combination of input manifold 122, output manifold 124 and the cooling channels (e.g., cooling channels 104, 106, 108, 110, 112 and 114) formed in lower surface 100 of cooling plate 36. Coolant supplied to input port 102 is distributed by input manifold 122 to the plurality of cooling channels. The coolant collects in output manifold 124 and is expelled through output port 103.

In order to provide efficient and uniform cooling for a large target (e.g., a target of about 350 mm or more), cooling plate 36 includes a relatively large number of equally spaced cooling channels (e.g., cooling channels 104, 106, 108, 110, 112 and 114) each having a small cross-sectional area (preferably in the range from about 2 mm$^2$ to about 4 mm$^2$). In the illustrative embodiment shown in FIG. 2, 28 cooling channels are formed each having a depth in the range from about 1.5 mm to about 2.5 mm, preferably about 2 mm. The spacing between the cooling channels is defined by the width of the partitioning walls (e.g., partitioning walls 116, 118 and 120). In the illustrative example shown in FIG. 2, the partitioning walls are each about 10 mm wide.

In accordance with the present invention, input manifold 122 and output manifold 124 are tapered such that their cross-sectional areas decrease in the directions away from input port 102 and output port 103, respectively. In the illustrative embodiment shown in FIG. 2, the width of the input manifold 122 in the vicinity of input port 102 is about 30 mm. The width of input manifold 122 gradually decreases to about 12 mm in the vicinity of cooling channel 106. The width of input manifold 122 decreases similarly in the opposite direction. Output manifold 124 is formed in a similar manner. The approximately crescent shape of each manifold can be characterized by the intersection of two circles each having a radius of about 165 mm with the centers of the circles being offset by about 32 mm. It should be understood that the cross-sectional areas of the manifolds may be reduced by adjusting the depths of the manifolds, either as an alternative to or in addition to adjusting the widths of the manifolds.

The use of tapered manifolds in accordance with the present invention promotes consistency in the level of turbulence of the flow of coolant across the plurality of cooling channels in the cooling plate 36. In particular, the use of tapered manifolds compensates for the drop in coolant pressure in input manifold 122 resulting from the flow of coolant through cooling channels located near input port 102 and output port 103. Without tapering, the flow of coolant through cooling channels 112 and 114, which are close to input port 102, would reduce the pressure of coolant in input manifold 122 in the vicinity of cooling channels 108 and 110. This would result in less turbulent flow of coolant through cooling channels 108 and 110. Turbulence would be even lower in cooling channels 104 and 106.

Tapering the manifolds as shown in FIG. 2 gradually increases the hydrodynamic impedance of the manifolds in the directions away from input port 102 and output port 103. This increase in hydrodynamic impedance compensates for the pressure drop resulting from the flow of coolant through the cooling channels. Tapered input manifold 102 and output manifold 103 thus advantageously promote turbulent coolant flow in cooling channels located remotely from input port 102 and output port 103. The hydrodynamic impedance of input manifold 122 and output manifold 124 increases in the directions away from input port 102 and output port 103, respectively, and this promotes nearly equal flow in all of the cooling channels (e.g., cooling channels 104, 106, 108, 110, 112 and 114) thus promoting uniform cooling of target assembly 22 using low coolant volume.

The use of cooling plate 36 having a relatively large number of cooling channels with small cross-sectional areas in combination with tapered manifolds promotes highly turbulent and uniform coolant flow through target assembly 22 (FIG. 1). This leads to efficient and uniform cooling of target assembly 22 (FIG. 1) during sputtering. Moreover, efficient and uniform cooling of target assembly 22 (FIG. 1) is achieved using low coolant volume. For example, using water as the coolant at an average temperature of 40° C. and a cooling channel cross-sectional area of 3.75 mm$^2$ (i.e., width=1.5 mm, depth=2.5 mm), highly turbulent coolant flow is achieved (Reynolds number of about 4800) with only 2.8 gallons of coolant per minute, which dissipates about 24 KW with a water temperature rise of about 40° C. (i.e., input coolant temperature of about 200° C., output coolant temperature of about 60° C.). If 5 gallons of coolant per minute are used, even greater turbulence is achieved (Reynolds number of about 8500), which dissipates about 36 KW with the aforementioned water temperature rise.

Reducing the cross-sectional area of the cooling channels increases coolant flow turbulence. For example, if the cooling channels are configured to have a cross-sectional area of 2.25 mm$^2$ (i.e., width=1.5 mm, depth=1.5 mm), a Reynolds number of about 6400 is achieved using 2.8 gallons of coolant per minute, which dissipates about 24 KW with a 40° C. water temperature rise. Using 5 gallons of coolant per minute in this configuration increases the Reynolds number to about 11,400, which dissipates about 36 KW with the same rise in water temperature. Thus, the present invention advantageously induces highly turbulent coolant flow (e.g., Reynolds number greater than 4000) in target assembly 22 using low coolant volume (e.g., about 5 gallons per minute or less).

The use of tapered input manifold 122 and output manifold 124 results in substantially equal distribution of coolant through the cooling channels which leads to uniform cooling of target assembly 22 (FIG. 1). Thus, for example, when 2.8 gallons of coolant per minute is used, about 0.1 gallons of coolant per minute flows through each of the 28 cooling channels in the illustrative embodiment shown in FIG. 2. When 5 gallons of coolant per minute is used, about 0.18 gallons of coolant per minute flows through each cooling channel. It has been determined that up to about 8 gallons of coolant per minute may be used to cool target assembly 22 (FIG. 1) when the cooling channels are about 1.5 mm wide and about 2.5 mm deep if greater power dissipation or lower coolant exit temperature is desired. When 8 gallons of coolant per minute are used, about 0.30 gallons of coolant per minute flows through each of the 28 cooling channels.

Figure 3:
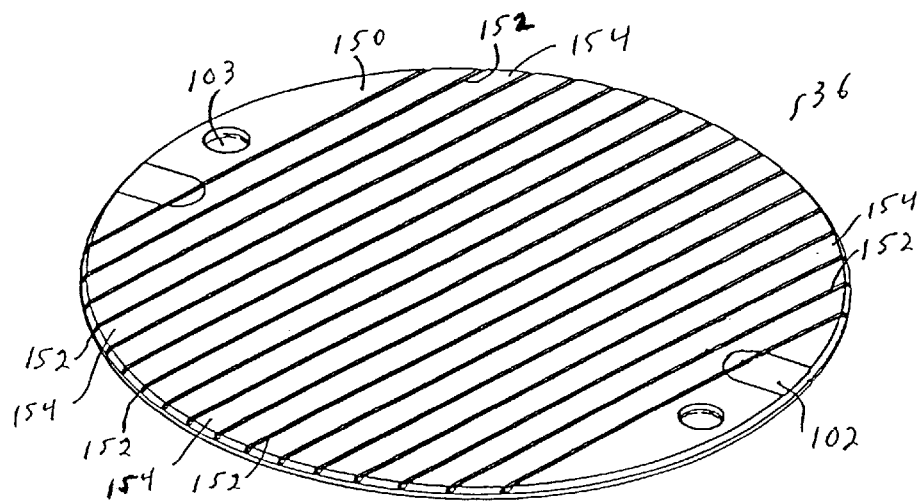
FIG. 3 is another perspective view of the cooling plate shown in FIG. 1, depicting a surface of the cooling plate having grooves oriented perpendicular to the cooling channels shown in FIG. 2 in accordance with the principles of the present invention.

Referring now to FIG. 3, an upper surface 150 of cooling plate 36 is described. Upper surface 150 of cooling plate 36 faces magnet assembly 56 (FIG. 1). Input port 102 and output port 103 are shown in FIG. 3 to extend through cooling plate 36. Upper surface 150 also includes a plurality of grooves 152 formed therein. Grooves 152 are oriented perpendicular to the direction of the cooling channels on lower surface 100 (FIG. 2) of cooling plate 36.

The cooling channels formed in lower surface 100 (FIG. 2) of cooling plate 36 may cause cooling plate 36 to be susceptible to uneven deformation when heat and pressure are applied during the process of bonding cooling plate 36 to target 34 (FIG. 1). In particular, cooling plate 36 may have a tendency to easily bend parallel to the cooling channels. Such deformation may cause gaps to be formed between cooling plate 36 and target 34 (FIG. 1) which can lead to coolant leaks in target assembly 22 (FIG. 1) and loss of vacuum in sputtering chamber 38 (FIG. 1).

Grooves 152 are formed in upper surface 150 of cooling plate 36 to increase the ease at which cooling plate 36 bends perpendicular to the cooling channels. With grooves 152, cooling plate 36 is more likely to conform to any change in shape experienced by target 34 (FIG. 1) during the bonding process. In the embodiment shown in FIG. 3, 17 equally spaced apart grooves 152 are provided, each having a depth of about 2 mm and a width of about 3 mm. Adjacent grooves 152 are separated by partitioning walls 154 each having a width of about 17 mm.

Figure 4:
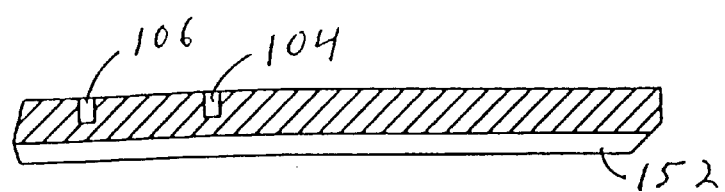
FIG. 4 is a fragmentary, cross-sectional view of the cooling plate shown in FIG. 2 taken along line 4—4 of FIG. 2.

FIG. 4 is a fragmentary, cross-sectional view of cooling plate 36 taken along line 4—4 of FIG. 2. The cross-section shown in FIG. 4 is taken through one of the grooves 152. Cooling channels 104 and 106 are also shown. As can be seen in FIG. 4, the thickness of cooling plate 36 is sufficient (e.g., about 6 mm) to ensure that grooves 152 do not compromise the integrity of the cooling channels (e.g., cooling channels 104 and 106).

Figure 5:
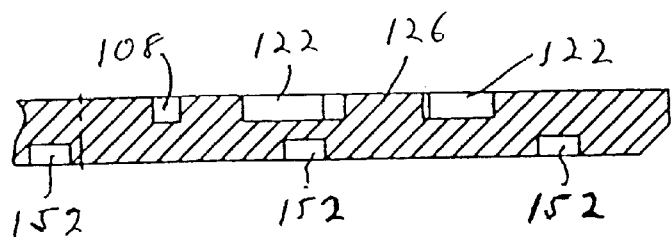
FIG. 5 is another fragmentary, cross-sectional view of the cooling plate shown in FIG. 2 taken along line 5—5 of FIG. 2.

FIG. 5 is a fragmentary, cross-sectional view of cooling plate 36 taken along line 5—5 of FIG. 2. Three grooves 152 are visible in FIG. 5. FIG. 5 also depicts a portion of input manifold 122, one of the islands 126, and cooling channel 108. As can be seen in FIG. 5, the depth of input manifold 122 may be made about the same as the depth of the cooling channels (e.g., in the range from about 1.5 mm to about 2.5 mm, preferably about 2.5 mm).

Figure 6:
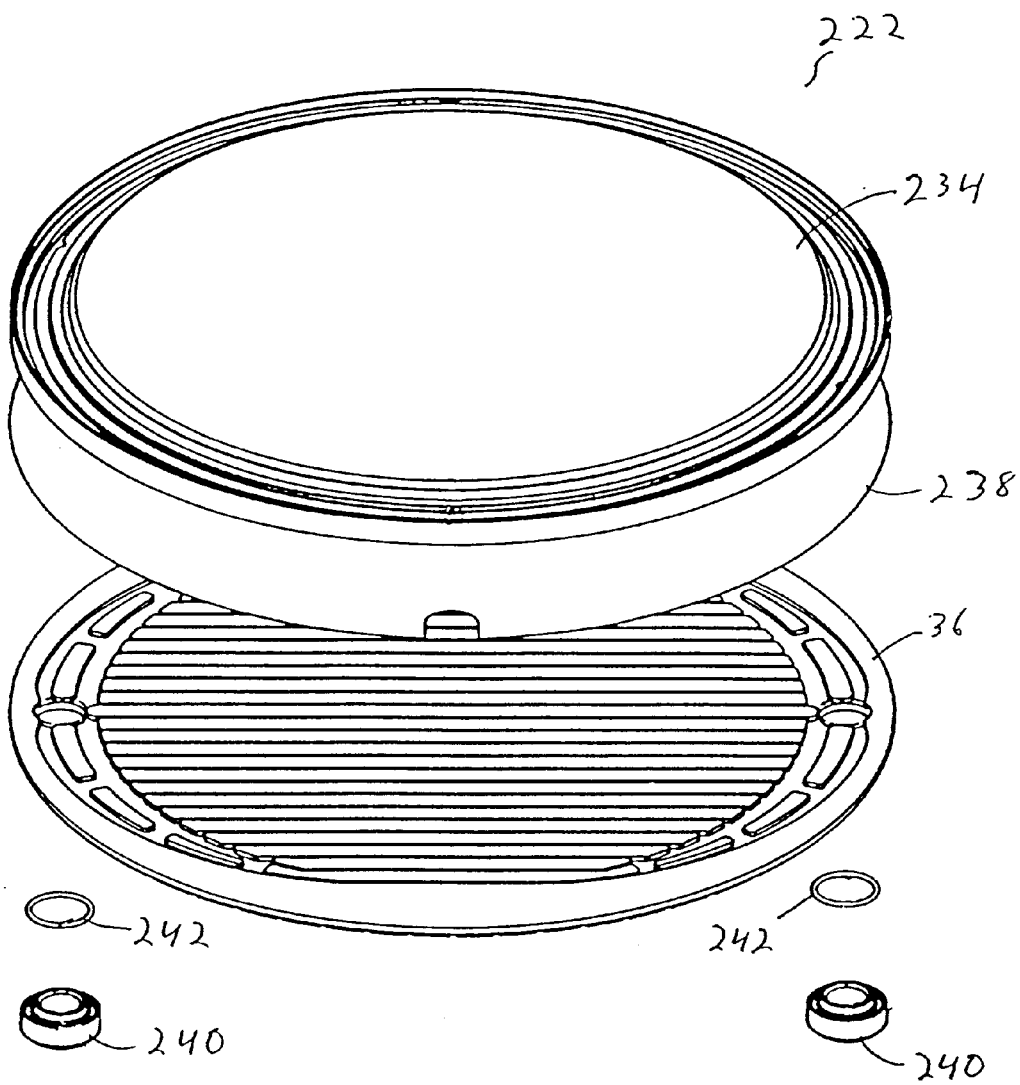
FIG. 6 is an exploded, perspective view of an internally cooled target assembly having a monolithic target in accordance with the principles of the present invention.

FIG. 6 depicts the use of cooling plate 36 of the present invention in a target assembly 222 that includes a monolithic target 234. Target assembly 222 may be used as target assembly 22 described above in connection with FIG. 1. Monolithic targets are suitable when the material to be sputtered is relatively inexpensive, such as aluminum.

Cooling plate 36 may be bonded to target 234 using any conventional means. As shown in FIG. 6, an epoxy film 238 may be used to bond cooling plate 36 to target 234. Bonding may also be accomplished by welding, particularly e-beam welding, or a combination of welding and an epoxy. A suitable epoxy is AF-191, supported, 0.035 weight, available from 3M Company located in St. Paul, Minn. A primer such as EC-3917 available from 3M Company may need to be applied to cooling plate 36 before using epoxy 238.

As shown in FIG. 6, a single sheet of epoxy film 238 may be applied between cooling plate 36 and target 234 to bond cooling plate 36 to target 234. When a sheet of epoxy is used, it may be desirable to increase the depth of the cooling channels, input manifold 122 and output manifold 124 to accommodate the flow of adhesive during the cure process into these structures of cooling plate 36. Alternatively, the epoxy film may be cut into strips that are suitably sized for placement on the partitioning walls (e.g., partitioning walls 116, 118 and 120 of FIG. 2), islands 126 (FIG. 2), and the raised perimeter of cooling plate 36.

Because the cooling channels of cooling plate 36 have a very small cross-sectional area, the flow of even a small amount of epoxy into a cooling channel may lead to a blockage (unless the depth of the cooling channels is increased to accommodate such flow, as described above). Thus, the epoxy strips to be applied to the partitioning walls of cooling plate 36 should be cut narrow enough to ensure that no epoxy flows into the cooling channels during the cure process. For the illustrative cooling plate embodiment disclosed herein, epoxy strips about 0.20 inches wide may be used.

The primer should be applied to cooling plate 36 and allowed to dry before applying the epoxy to cooling plate 36. The thin strips of epoxy film cut for use on the partitioning walls should be carefully centered on the partitioning walls. Air bubbles should be removed from the epoxy, then target 234 may be placed on cooling plate 36. Vacuum bagging may then be used to further remove air bubbles from the epoxy.

Curing may be accomplished through press curing or autoclave curing. For press curing, a uniform pressure of about 45 psi should be applied to the contact areas of target assembly 222. Pressure should be applied before the start of heat-up, which should not exceed 5° F. per minute. Curing should take place for about 60 minutes at about 350° F. The cooling rate should not exceed 20° F. per minute down to about 110° F. under pressure.

For autoclave curing, pressure should be applied prior to the start of temperature increase, which should not exceed 5° F. per minute. The pressure during curing should be maintained at about 40 psi. Curing should take place for about 60 minutes at about 350° F. The cooling rate should not exceed 10° F. down to about 110° F. or ambient under pressure in the autoclave. Pressure may then be released.

Hose connectors 240 are connected to cooling plate 36 with O-rings 242. Hose connectors 240 are used to connect target assembly 222 to hoses 70 and 72 (FIG. 1).

Figure 7:
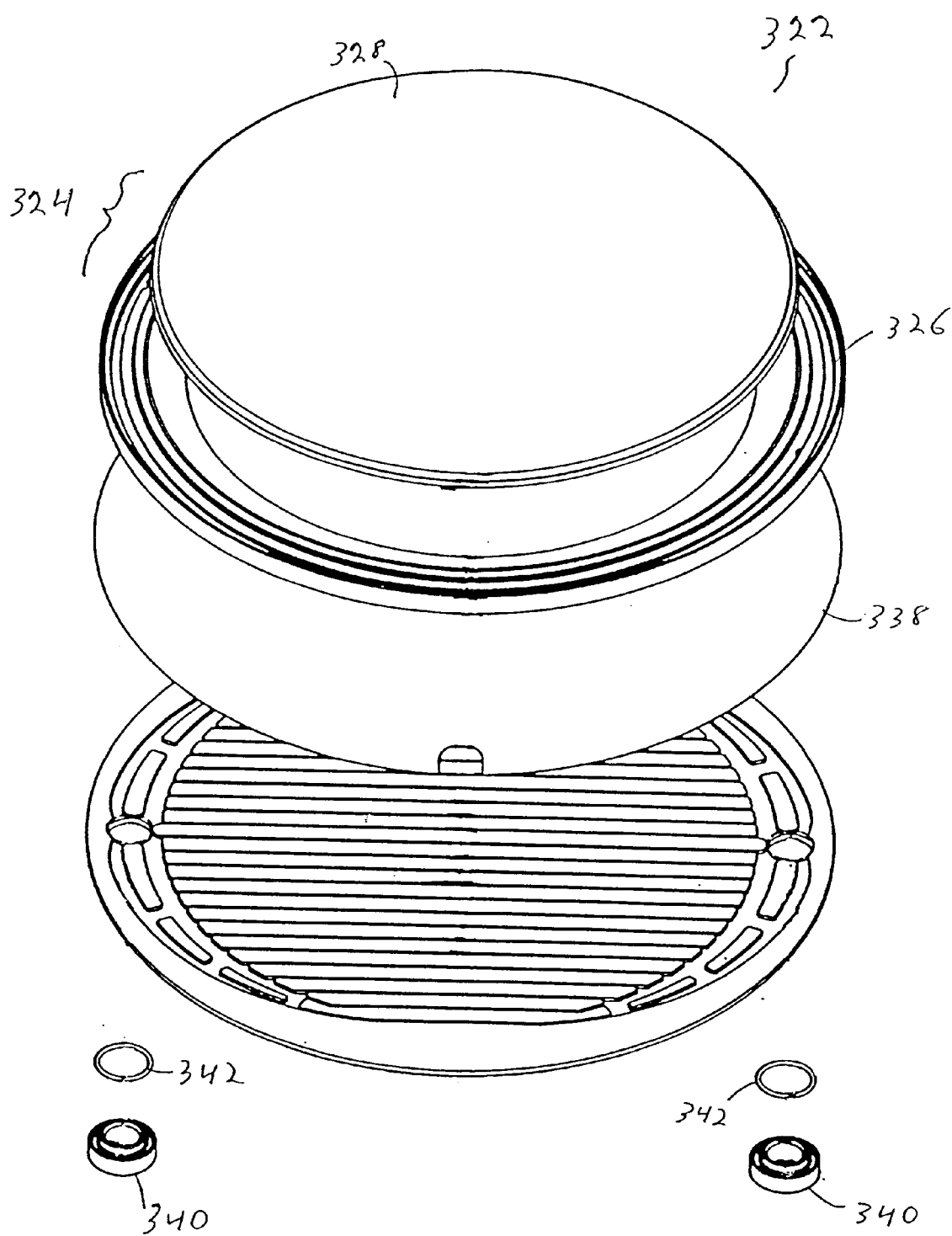
FIG. 7 is an exploded, perspective view of an internally cooled target assembly having a composite target in accordance with the principles of the present invention.

FIG. 7 depicts the use of cooling plate 36 of the present invention in a target assembly 322 that includes a composite target 324. Composite target 324 includes target backing plate 326 and target 328 which may be diffusion bonded together in a conventional manner. Target assembly 322 may be used as target assembly 22 described above in connection with FIG. 1. Composite targets may be preferable when the material to be sputtered is relatively expensive, such as gold or titanium. Backing plate 326 may be made from a relatively inexpensive material, such as aluminum. Hose connectors 340 and O-rings 342 are used to connect target assembly 322 to hoses 70 and 72 (FIG. 1). Cooling plate 36 may be bonded to target 334 using epoxy film 338, welding, a combination of epoxy and welding, or any other suitable means, as described above in connection with FIG. 6. It should be noted, however, that press curing may not be suitable for target assembly 322. The epoxy may be autoclave cured as described above.

It should be understood that the principles of the present invention may be used in connection with sputtering apparatus other than that described herein. For example, the cooling plate design disclosed herein may be used in the sputtering apparatus disclosed in the above-incorporated U.S., now abandoned patent application Ser. No. 08/684,440. Although the present invention has been described in the context of a sputtering apparatus having a large diameter target, the invention may also be used in sputtering devices with smaller targets.

Thus an internally cooled sputtering target assembly configured to promote highly turbulent coolant flow through the target assembly to achieve efficient and uniform target cooling is provided. Those skilled in the art will appreciate that the present invention may be practiced by other than the described embodiments, which are presented for purposes of illustration and not of limitation, and the present invention is limited only by the claims that follow.

What is claimed is:

1. A sputtering device for depositing material onto a substrate, comprising:
   a substrate support;
   a rotatable magnet assembly; and
   a target assembly disposed between said substrate support and said rotatable magnet assembly, said target assembly comprising:
      a coolant input port through which coolant is received into said target assembly;
      a coolant output port through which coolant is expelled from said target assembly;
      a plurality of cooling channels for distributing coolant through said target assembly, said cooling channels having first ends for receiving coolant provided through said input port and second ends coupled to said output port;
      an input manifold coupling said input port to said first ends of said cooling channels, said input manifold having a hydrodynamic impedance per distance that increases in a direction away from said input port to induce substantially uniform coolant flow through said plurality of cooling channels, and wherein said input manifold comprises islands which provide regions of contact for bonding a target to said cooling plate;
      said target having a sputtering surface from which material is to be sputtered facing said substrate support; and
      a cooling plate having a first surface bonded to a second surface of said target opposite said sputtering surface, wherein said cooling channels and said input manifold are formed in said first surface of said cooling plate and enclosed by said target.

2. A sputtering device for depositing material onto a substrate, comprising:
   a substrate support;
   a rotatable magnet assembly; and
   a target assembly disposed between said substrate support and said rotatable magnet assembly, said target assembly comprising:
      a coolant input port through which coolant is received into said target assembly;
      a coolant output port through which coolant is expelled from said target assembly;
      a plurality of cooling channels for distributing coolant through said target assembly, said cooling channels having first ends for receiving coolant provided through said input port and second ends coupled to said output port, and wherein said plurality of cooling channels comprise a plurality of parallel cooling channels;
      an input manifold coupling said input port to said first ends of said cooling channels, said input manifold having a hydrodynamic impedance per distance that increases in a direction away from said input port to induce substantially uniform coolant flow through said plurality of cooling channels;
      a target having a sputtering surface from which material is to be sputtered facing said substrate support; and
      a cooling plate comprising:
         a first surface bonded to a second surface of said target opposite said sputtering surface, wherein said cooling channels and said input manifold are formed in said first surface of said cooling plate and enclosed by said target; and
         a second surface opposite said first surface, said second surface of said cooling plate having grooves formed therein, said grooves being oriented substantially perpendicular to said plurality of parallel cooling channels.

3. A sputtering device for depositing material onto a substrate, comprising:
   a substrate support;
   a rotatable magnet assembly; and
   a target assembly disposed between said substrate support and said rotatable magnet assembly, said target assembly comprising:
      a coolant input port through which coolant is received into said target assembly;
      a coolant output port through which coolant is expelled from said target assembly;
      a plurality of cooling channels for distributing coolant through said target assembly said cooling channels having first ends for receiving coolant provided through said input port and second ends coupled to said output port;
      a target having a sputtering surface from which material is to be sputtered facing said substrate support;
      a cooling plate having a first surface bonded to a second surface of said target opposite said sputtering surface wherein said cooling channels and an input manifold are formed in said first surface of said cooling plate and enclosed by said target; and
      said input manifold coupling said input port to said first ends of said cooling channels, wherein said input manifold and said plurality of cooling passages are configured to promote highly turbulent coolant flow through each of said plurality of cooling channels, the level of turbulence being characterized by a Reynolds number of at least about 4000, wherein said input manifold comprises islands which provide regions of contact for bonding said target to said cooling plate.

4. A sputtering device for depositing material onto a substrate, comprising:
   a substrate support;
   a rotatable magnet assembly; and
   a target assembly disposed between said substrate support and said rotatable magnet assembly, said target assembly comprising:
      a coolant input port through which coolant is received into said target assembly;
      a coolant output port through which coolant is expelled from said target assembly;
      a plurality of cooling channels for distributing coolant through said target assembly, said cooling channels having first ends for receiving coolant provided through said input port and second ends coupled to said output port and wherein said plurality of cooling channels comprise a plurality of parallel cooling channels;

a target having a sputtering surface from which material is to be sputtered facing said substrate support;

a cooling plate comprising:

a first surface bonded to a second surface of said target opposite said sputtering surface, wherein said cooling channels and an input manifold are formed in said first surface of said cooling plate and enclosed by said target; and a second surface opposite said first surface, said second surface of said cooling plate having grooves formed therein, said grooves being oriented substantially perpendicular to said plurality of parallel cooling channels; and said input manifold coupling said input port to said first ends of said cooling channels, wherein said input manifold and said plurality of cooling passages are configured to promote highly turbulent coolant flow through each of said plurality of cooling channels, the level of turbulence being characterized by a Reynolds number of at least about 4000.

5. A target assembly for use in a sputtering device, comprising:

a coolant input port through which coolant is received into said target assembly;

a coolant output port through which coolant is expelled from said target assembly;

a plurality of cooling channels for distributing coolant through said target assembly, said cooling channels having first ends for receiving coolant provided through said input port and second ends coupled to said output port;

an input manifold coupling said input port to said first ends of said cooling channels, said input manifold having a hydrodynamic impedance per distance that increases in a direction away from said input port to induce substantially uniform coolant flow through said plurality of cooling channels, and wherein said input manifold comprises islands which provide regions of contact for bonding an target to said cooling plate;

said target having a sputtering surface from which material is to be sputtered facing said substrate support; and a cooling plate having a first surface bonded to a second surface of said target opposite said sputtering surface wherein said cooling channels and said input manifold are formed in said first surface of said cooling plate and enclosed by said target.

6. A target assembly for use in a sputtering device, comprising:

a coolant input port through which coolant is received into said target assembly;

a coolant output port through which coolant is expelled from said target assembly;

a plurality of cooling channels for distributing coolant through said target assembly, said cooling channels having first ends for receiving coolant provided through said input port and second ends coupled to said output port, and wherein said plurality of cooling channels comprise a plurality of parallel cooling channels;

an input manifold coupling said input port to said first ends of said cooling channels, said input manifold having a hydrodynamic impedance per distance that increases in a direction away from said input port to induce substantially uniform coolant flow through said plurality of cooling channels;

a target having a sputtering surface from which material is to be sputtered facing said substrate support; and a cooling plate comprising:

a first surface bonded to a second surface of said target opposite said sputtering surface, wherein said cooling channels and said input manifold are formed in said first surface of said cooling plate and enclosed by said target; and a second surface opposite said first surface said second surface of said cooling plate having grooves formed therein, said grooves being oriented substantially perpendicular to said plurality of parallel cooling channels.

7. A target assembly for use in a sputtering device, comprising:

a coolant input port through which coolant is received into said target assembly;

a coolant output port through which coolant is expelled from said target assembly;

a plurality of cooling channels for distributing coolant through said target assembly, said cooling channels having first ends for receiving coolant provided through said input port and second ends coupled to said output port;

a target having a sputtering surface from which material is to be sputtered facing said substrate support;

a cooling plate having a first surface bonded to a second surface of said target opposite said sputtering surface, wherein said cooling channels and an input manifold are formed in said first surface of said cooling plate and enclosed by said target; and said input manifold coupling said input port to said first ends of said cooling channels, wherein said input manifold and said plurality of cooling passages are configured to promote highly turbulent coolant flow through each of said plurality of cooling channels, the level of turbulence being characterized by a Reynolds number of at least about 4000, and wherein said input manifold comprises islands which provide regions of contact for bonding said target to said cooling plate.

8. A target assembly for use in a sputtering device, comprising:

a coolant input port through which coolant is received into said target assembly;

a coolant output port through which coolant is expelled from said target assembly;

a plurality of cooling channels for distributing coolant through said target assembly, said cooling channels having first ends for receiving coolant provided through said input port and second ends coupled to said output port, and wherein said plurality of cooling channels comprise a plurality of parallel cooling channels;

an input manifold coupling said input port to said first ends of said cooling channels, wherein said input manifold and said plurality of cooling passages are configured to promote highly turbulent coolant flow through each of said plurality of cooling channels, the level of turbulence being characterized by a Reynolds number of at least about 4000;

a target having a sputtering surface from which material is to be sputtered facing said substrate support; and a cooling plate comprising:

a first surface bonded to a second surface of said target opposite said sputtering surface, wherein said cooling channels and said input manifold are formed in said first surface of said cooling plate and enclosed by said target; and a second surface opposite said first surface, said second surface of said cooling plate having grooves formed therein, said grooves being oriented substantially perpendicular to said plurality of parallel cooling channels.

* * * * *